(12) United States Patent
Li et al.

(10) Patent No.: US 12,326,791 B2
(45) Date of Patent: Jun. 10, 2025

(54) TEST CIRCUIT, METHOD, AND APPARATUS FOR TO-BE-TESTED MODULE

(71) Applicant: Horizon Journey (Hangzhou) Artificial Intelligence Technology Co., Ltd., Zhejiang (CN)

(72) Inventors: Jing Li, Zhejiang (CN); Yi Zhou, Zhejiang (CN); Luyang Zhang, Zhejiang (CN); Wenxing Li, Zhejiang (CN)

(73) Assignee: Horizon Journey (Hangzhou) Artificial Intelligence Technology Co., Ltd., ZheJiang (CN)

( * ) Notice: Subject to any disclaimer, the term of this patent is extended or adjusted under 35 U.S.C. 154(b) by 0 days.

(21) Appl. No.: 17/907,666

(22) PCT Filed: Mar. 30, 2022

(86) PCT No.: PCT/US2022/084160
§ 371 (c)(1),
(2) Date: Sep. 28, 2022

(87) PCT Pub. No.: WO2022/228014
PCT Pub. Date: Nov. 3, 2022

(65) Prior Publication Data
US 2024/0211361 A1    Jun. 27, 2024

(30) Foreign Application Priority Data
Apr. 30, 2021  (CN) .......................... 202110487704.6

(51) Int. Cl.
*G06F 11/00*   (2006.01)
*G06F 11/26*   (2006.01)
(Continued)

(52) U.S. Cl.
CPC .......... *G06F 11/261* (2013.01); *G06F 11/263* (2013.01); *G06F 11/2733* (2013.01)

(58) Field of Classification Search
CPC .......................... G06F 11/263; G06F 11/2733
See application file for complete search history.

(56) References Cited

U.S. PATENT DOCUMENTS 6,971,045 B1   11/2005  Deb et al.
11,091,169 B2 *  8/2021  Druml ..................... G01S 7/497
(Continued)

FOREIGN PATENT DOCUMENTS

CN    108600047 A    9/2018
CN    111624477 A    9/2020
(Continued)

OTHER PUBLICATIONS

International Search Report and Written Opinion for International PCT Application No. PCT/CN2022/084160, dated Jun. 17, 2022.
(Continued)

*Primary Examiner* — Amine Riad
(74) *Attorney, Agent, or Firm* — K&L Gates LLP

(57) ABSTRACT

Disclosed are a test circuit, method, and apparatus for a to-be-tested module. The circuit includes a test data generation module including a plurality of test data generation units, each of which is configured to generate test data consistent with a data type supported by itself based on raw data consistent with the data type; and a functional safety module electrically connected to the to-be-tested module and each test data generation unit; the functional safety module being configured to perform check operation processing on the test data to obtain a first processing result, and to perform check operation processing and fault injection processing on the test data to obtain a second processing result; and the to-be-tested module being configured to
(Continued)

generate a test result based on test data, first processing result, and second processing result. Embodiments of this disclosure can achieve multi-channel testing, thereby satisfying application requirement for processing multi-channel inputs.

20 Claims, 4 Drawing Sheets

(51) Int. Cl.
    *G06F 11/263*     (2006.01)
    *G06F 11/273*     (2006.01)

(56) References Cited

U.S. PATENT DOCUMENTS

| | | |
|---|---|---|
| 2012/0266033 A1 | 10/2012 | Gold et al. |
| 2014/0019818 A1 | 1/2014 | Jindal et al. |
| 2019/0051370 A1 | 2/2019 | Azam et al. |
| 2019/0176838 A1 | 6/2019 | Kakoee et al. |

FOREIGN PATENT DOCUMENTS

| | | |
|---|---|---|
| CN | 111856258 A | 10/2020 |
| CN | 112242177 A | 1/2021 |
| CN | 113295943 A | 8/2021 |

OTHER PUBLICATIONS

Cui Yuanyuan et al., Verification Methodology and Implement Ation of EDAC Circuit Based on LBIST, Computer Measurement and Control (Dec. 31, 2014), 7:2146-2153.

\* cited by examiner

TEST CIRCUIT, METHOD, AND APPARATUS FOR TO-BE-TESTED MODULE

CROSS-REFERENCE TO RELATED APPLICATIONS

This application is a U.S. National Stage Entry under 35 U.S.C. § 371 of International Patent Application No. PCT/CN2022/084160, entitled TEST CIRCUIT, METHOD, AND APPARATUS FOR TO-BE-TESTED MODULE, filed Feb. 18, 2022, which claims priority to and the benefit of Chinese patent Application No. 202110487704.6, filed with the Chinese National Intellectual Property Administration on Apr. 30, 2021 and entitled TEST CIRCUIT, METHOD, AND APPARATUS FOR TO-BE-TESTED MODULE, the entire disclosures of which are incorporated by reference in their entirety herein.

FIELD OF THE INVENTION

The present disclosure relates to the field of testing technologies, and in particular, to a test circuit, a method, and an apparatus for a to-be-tested module.

BACKGROUND OF THE INVENTION

In many cases, a module needs to be tested. For example, in the field of image processing, an image path, an image signal processing (ISP) unit, and the like need to be tested by using a test circuit.

It should be noted that, with constant development of technologies, there is an application requirement for processing multi-channel inputs in the field of image processing. However, a conventional test circuit is only suitable for single-channel testing and cannot meet this application requirement.

SUMMARY OF THE INVENTION

To resolve the foregoing technical problem, the present disclosure is proposed. Embodiments of the present disclosure provide a test circuit, method, and apparatus for a to-be-tested module. Specifically, the following technical solutions are disclosed.

According to an aspect of an embodiment of the present disclosure, there is provided a test circuit for a to-be-tested module, including a test data generation module and a functional safety module, wherein
   the test data generation module includes a plurality of test data generation units, and each test data generation unit is electrically connected to the functional safety module;
   each test data generation unit is configured to generate test data consistent with a data type supported by the test data generation unit based on raw data consistent with the data type;
   the functional safety module is electrically connected to the to-be-tested module, and is configured to perform check operation processing on the test data to obtain a first processing result, and to perform check operation processing and fault injection processing on the test data to obtain a second processing result; and
   the to-be-tested module is configured to generate a test result based on the test data, the first processing result, and the second processing result.

According to another aspect of an embodiment of the present disclosure, there is further provided a test method for a to-be-tested module, wherein the method can be applied to the foregoing test circuit for a to-be-tested module, and specially, the method includes:
   invoking each test data generation unit in the test circuit to generate test data consistent with a data type supported by the test data generation unit based on raw data consistent with the data type;
   performing check operation processing on the test data, to obtain a first processing result;
   performing check operation processing and fault injection processing on the test data, to obtain a second processing result; and
   generating a test result of the to-be-tested module based on the test data, the first processing result, and the second processing result.

Optionally, according to still another aspect of an embodiment of the present disclosure, there is further provided a test apparatus for a to-be-tested module, wherein the apparatus can be applied to the foregoing test circuit for a to-be-tested module, and specially, the apparatus includes:
   a first generation module, configured to invoke each test data generation unit in the circuit to generate test data consistent with a data type supported by the test data generation unit based on raw data consistent with the data type;
   a first processing module, configured to perform check operation processing on the test data generated by the first generation module, to obtain a first processing result;
   a second processing module, configured to perform check operation processing and fault injection processing on the test data generated by the first generation module, to obtain a second processing result; and
   a second generation module, configured to generate a test result of the to-be-tested module based on the test data generated by the first generation module, the first processing result obtained by the first processing module, and the second processing result obtained by the second processing module.

According to still another aspect of an embodiment of the present disclosure, there is provided a computer readable storage medium, wherein the storage medium stores a computer program, and when the computer program is executed, the foregoing test method for a to-be-tested module can be implemented.

According to still another aspect of an embodiment of the present disclosure, there is provided an electronic device, including: a processor; and a memory, configured to store processor-executable instructions,
   wherein the processor is configured to read the executable instructions from the memory, and execute the instructions to implement the foregoing test method for a to-be-tested module.

Based on the test circuit, the method, and the apparatus for a to-be-tested module, the computer readable storage medium, and the electronic device that are provided in the foregoing embodiments of the present disclosure, each test data generation unit in the test data generation module can serve as a data generation channel, and each data generation channel can provide the corresponding test data to the functional safety module, then the functional safety module can perform functional safety-related processing based on the test data, and provide the test data, and the first processing result and the second processing result that are obtained through processing to the to-be-tested module, so as to test the to-be-tested module accordingly. In view of the above, in the embodiments of the present disclosure, multi-channel testing can be implemented by disposing a plurality of test data generation units and using the plurality of test data generation units in combination with the functional safety module, so that an application requirement for processing multi-channel inputs can be met.

BRIEF DESCRIPTION OF THE DRAWINGS

By describing the embodiments of the present disclosure more detailed with reference to the accompanying drawings, the foregoing and other objectives, features, and advantages of the present disclosure will become more apparent. The accompanying drawings are used to provide further understanding of the embodiments of the present disclosure, constitute a part of the specification, and are used to explain the present disclosure together with the embodiments of the present disclosure, but do not constitute limitation to the present disclosure. In the accompanying drawings, the same reference numerals generally represent the same components or steps.

DETAILED DESCRIPTION OF THE EMBODIMENTS

Figure 1:
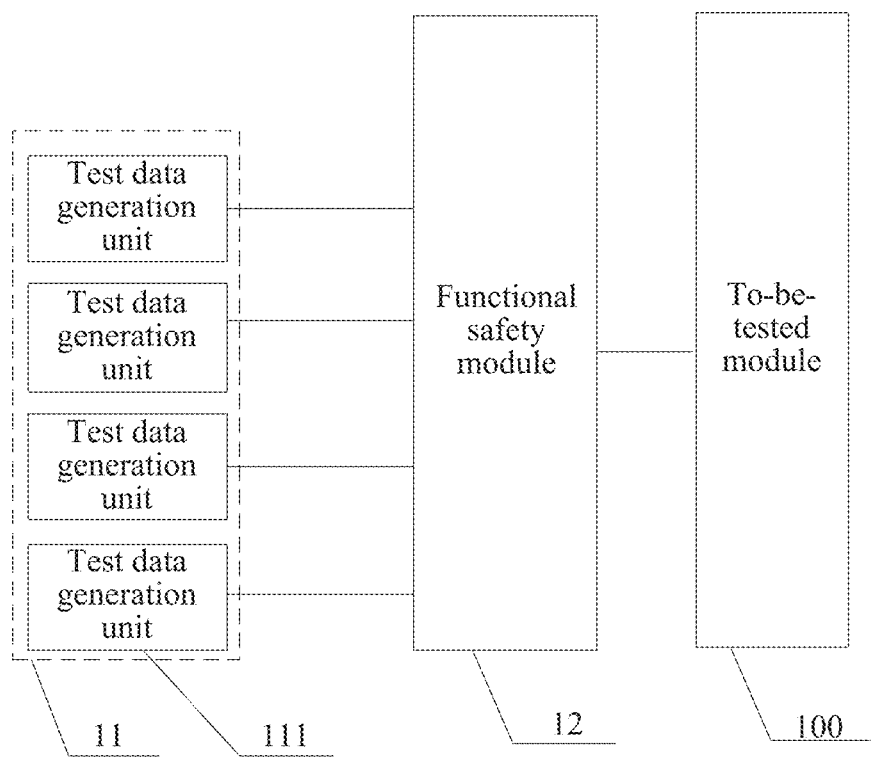
FIG. 1 is a schematic structural diagram of a test circuit for a to-be-tested module according to an exemplary embodiment of the present disclosure.

Exemplary embodiments of the present disclosure are described below in detail with reference to the accompanying drawings. Obviously, the described embodiments are merely a part, rather than all of embodiments of the present disclosure. It should be understood that the present disclosure is not limited by the exemplary embodiments described herein.

It should be noted that unless otherwise specified, the scope of the present disclosure is not limited by relative arrangements, numeric expressions, and numerical values of components and steps described in these embodiments.

A person skilled in the art may understand that terms such as "first" and "second" in the embodiments of the present disclosure are merely used to distinguish between different steps, devices, or modules, and indicate neither any particular technical meaning, nor necessarily logical ordering among them.

It should be further understood that, in the embodiments of the present disclosure, the term "multiple/a plurality of" may refer to two or more, and the term "at least one" may refer to one, two, or more.

It should be further understood that, any component, data, or structure involved in the embodiments of the present disclosure may be generally construed to one or more, unless clearly stated or the context indicates otherwise.

In addition, the term "and/or" in the present disclosure refers to only an association relationship that describes associated objects, indicating presence of three relationships. For example, A and/or B may indicate presence of three cases: A alone, both A and B, and B alone. In addition, the character "/" in the present disclosure generally indicates an "or" relationship of associated objects.

It should be further understood that, the descriptions of various embodiments of the present disclosure focus on differences among the various embodiments. The same or similar parts among the embodiments may refer to one another. For concision, related description is not repeated.

Meanwhile, it should be understood that, for ease of description, the accompanying drawings are not necessarily to scale in size of any of parts shown therein.

Descriptions of at least one exemplary embodiment below are actually illustrative only, and never serve as any limitation to the present disclosure along with application or use thereof.

Technologies, methods, and devices known by a person of ordinary skills in the related fields may not be discussed in detail herein. However, where appropriate, the technologies, the methods, and the devices shall be regarded as a part of the specification.

It should be noted that, similar signs and letters in the following accompanying drawings indicate similar items. Therefore, once a certain item is defined in one of the accompanying drawings, there is no need to further discuss the item in the subsequent accompanying drawings.

The embodiments of the present disclosure may be applicable to a terminal device, a computer system, a server, and other electronic devices, which may be operated together with numerous other general-purpose or special-purpose computing system environments or configurations. It should be noted that the electronic device may include a system on chip (SOC). The SOC may include a central processing unit (CPU), various other types of processors, various data processing paths, a memory, and the like. An operating system can run on the SOC, and the embodiments of the present disclosure may be specifically applied to the interior of the SOC, for example, the interior of a vehicle-mounted SOC. Well-known examples of the terminal devices, the computing systems, and environment and/or configuration applicable to be used with the terminal device, the computer system, the server, and other electronic devices include but are not limited to: a device or system including an automotive chip, a personal computer system, a server computer system, a thin client, a thick client, a handheld or laptop device, a microprocessor-based system, a set-top box, programmable consumer electronics, a network personal computer, a small computer system, a mainframe computer system, and a distributed cloud computing technology environment including any of the foregoing systems.

The electronic device such as a terminal device, a computer system, or a server may be described in general context of executable instructions (such as a program module) of a computer system. Generally, the program module may include a routine, a program, a target program, a component, logic, a data structure, and the like that execute particular tasks or implement particular abstract data types. The computer system/server may be implemented in a distributed cloud computing environment. In the distributed cloud computing environment, a task is performed by a remote processing device linked through a communications network. In the distributed cloud computing environment, the program module may be located on a storage medium of a local or remote computing system including a storage device.

Application Overview

In the field of image processing, a to-be-tested module such as an image path or an ISP unit needs to be tested by using a test circuit. A conventional test scheme is generally to output a colorful test data stream or a static grayscale test data stream to the to-be-tested module in a single channel. However, in this way, only single-channel testing can be implemented, and multiple-channel testing cannot be implemented. As a result, an application requirement of a user for processing multi-channel inputs cannot be met.

Exemplary System

To resolve the problem described in the application overview that a conventional test scheme cannot meet an application requirement of a user for processing multi-channel inputs, regarding a to-be-tested module, a test circuit for a to-be-tested module that is provided in an embodiment of the present disclosure can be provided. The test circuit for a to-be-tested module can be electrically connected to the to-be-tested module, and can automatically run after hardware initialization is completed, thereby implementing multiple-channel testing, so as to meet the application requirement of the user for processing multi-channel inputs.

Exemplary Circuit

FIG. 1 is a schematic structural diagram of a test circuit for a to-be-tested module 100 according to an exemplary embodiment of the present disclosure. As shown in FIG. 1, the test circuit for the to-be-tested module 100 includes a test data generation module 11 and a functional safety module 12.

The test data generation module 11 includes a plurality of test data generation units 111, and each test data generation unit 111 is electrically connected to the functional safety module 12.

Each test data generation unit 111 is configured to generate test data consistent with a data type supported by the test data generation unit 111 based on raw data consistent with the data type.

The functional safety module 12 is electrically connected to the to-be-tested module 100, and is configured to perform check operation processing on the test data to obtain a first processing result, and to perform check operation processing and fault injection processing on the test data to obtain a second processing result.

The to-be-tested module 100 is configured to generate a test result based on the test data, the first processing result, and the second processing result.

For example, there may be two, three, four, or more than four test data generation units 111 in the test data generation module 11. Moreover, data types supported by different test data generation units 111 may be the same or different. For example, the data types supported by two or more test data generation units 111 are all YUV, which can be understood as a color coding method, where "Y" represents luminance (or luma), that is, a gray-scale value; and "U" and "V" represent chrominance (or chroma), which is used to describe a color and saturation of an image and is used to specify a color of a pixel. For another example, the data type supported by a certain test data generation unit 111 is YUV, and the data type supported by another test data generation unit 111 is a Raw (which refers to unprocessed) type; and/or, raw data corresponding to different test data generation units 111 may be the same or different.

In addition, the to-be-tested module 100 may be a module that needs to be tested in an automotive artificial intelligence (AI) chip, such as an image path, an ISP unit, or another post-processing module.

Any test data generation unit 111 can generate raw data consistent with the data type supported by itself according to set data generation logic, and generate the test data consistent with the data type supported by itself based on the generated raw data. The test data generated by different test data generation units 111 may be different.

It should be noted that all test data involved in this embodiment of the present disclosure is image data used to simulate exposure data of a camera. In addition, the electrical connection between the functional safety module 12 and the to-be-tested module 100 may be understood as: the functional safety module 12 as a part of the test circuit, is connected to the to-be-tested module 100, and is configured to perform operations such as check operation processing and fault injection processing on the test data. However, the to-be-tested module 100 is not a part of the test circuit. The to-be-tested module 100 can be connected to the test circuit as a component under test.

After generating the test data, the test data generation unit 111 can provide the generated test data to the functional safety module 12 through the electrical connection between it and the functional safety module 12. Correspondingly, the functional safety module 12 can perform functional safety-related processing based on the obtained test data. For example, check operation processing is performed on the test data, to obtain the first processing result; and check operation processing and fault injection processing are performed on the obtained test data, to obtain the second processing result.

Optionally, the functional safety module 12 can perform check operation processing on the obtained test data according to a preset check algorithm, to obtain the first processing result. For example, the functional safety module 12 can perform a cyclic redundancy check (CRC) operation on the obtained test data according to a preset CRC polynomial, to obtain a corresponding CRC value. The obtained CRC value is taken as the first processing result.

For another example, the functional safety module 12 can further generate a 1-bit protection bit for every 8-bits or 16-bit data in the obtained test data according to a parity protection algorithm. The 1-bit protection bit may be taken as the first processing result.

For ease of understanding, description is made below by using an example in which the preset check algorithm only includes the CRC algorithm.

Optionally, when the functional safety module 12 performs check operation processing and fault injection processing on the obtained test data to obtain the second processing result, the check operation processing may be performed either before the fault injection processing or after the fault injection processing. A processing order between the check operation processing and the fault injection processing is not limited in this embodiment.

After obtaining the first processing result and the second processing result, the functional safety module 12 can provide the obtained test data, the first processing result, and the second processing result to the to-be-tested module 100 based on the electrical connection between the functional safety module 12 and the to-be-tested module 100, so that the to-be-tested module 100 generates the test result accordingly. The test result can be used to indicate whether the to-be-tested module 100 passes a test when testing is made by using the test data generation unit 111 corresponding to the test data provided by the functional safety module 12. In this case, it is equivalent to that single-channel testing of the to-be-tested module 100 is implemented. Because there are a plurality of test data generation units 111 in the test data generation module 11, multi-channel testing of the to-be-tested module 100 can be implemented based on the plurality of test data generation units 111.

In the test circuit for the to-be-tested module 100 provided in this embodiment of the present disclosure, each test data generation unit 111 in the test data generation module 11 can serve as a data generation channel, and each data generation channel can further provide the corresponding test data to the functional safety module 12. In this way, the functional safety module 12 can perform functional safety-related processing accordingly, and provide the test data provided by the data generation channel and the first processing result and the second processing result that are obtained through processing to the to-be-tested module 100, so as to test the to-be-tested module 100 accordingly. In view of the above, in this embodiment, multi-channel testing can be implemented by disposing a plurality of test data generation units 111, and using the plurality of test data generation units 111 in combination with the functional safety module 12, so that an application requirement of a user for processing multi-channel inputs can be met.

In an optional example, the functional safety module 12 is configured to perform fault injection processing on the test data, and perform, according to a preset check algorithm, check operation processing on the test data performed with fault injection processing, to obtain the second processing result.

Alternatively, the functional safety module 12 is configured to perform check operation processing on the test data according to a preset check algorithm, and perform fault injection processing on an obtained check operation processing result, to obtain the second processing result.

Alternatively, the functional safety module 12 is configured to perform fault injection processing on an algorithm parameter of a preset check algorithm, and perform check operation processing on the test data according to the preset check algorithm whose algorithm parameter is performed with fault injection processing, to obtain the second processing result.

It should be noted that, three implementations are provided in the embodiments of the present disclosure to obtain the second processing result, and the three implementations are described below by using examples.

First Implementation:

After obtaining the test data from any test data generation unit 111, the functional safety module 12 can perform fault injection processing on the obtained test data according to a preset fault injection manner. For example, at least one character in the obtained test data is modified to another character, so as to obtain the test data performed with fault injection processing. Subsequently, the functional safety module 12 can perform, according to a preset check algorithm, check operation processing on the test data performed with fault injection processing. For example, the functional safety module 12 can perform a CRC operation on the test data performed with fault injection processing according to a preset CRC polynomial, to obtain a corresponding CRC value. The obtained CRC value may be taken as the second processing result.

Second Implementation:

After obtaining the test data from any test data generation unit 111, the functional safety module 12 can perform check operation processing on the obtained test data according to a preset check algorithm. For example, the functional safety module 12 can perform a CRC operation on the obtained test data, to obtain a corresponding CRC value. The obtained CRC value may be taken as the check operation processing result. Subsequently, the functional safety module 12 can perform fault injection processing on the obtained check operation processing result according to a preset fault injection manner, in which, for example, at least one character in the obtained check operation processing result is modified to another character, so as to obtain a check operation processing result performed with fault injection processing. The check operation processing result performed with fault injection processing may be taken as the second processing result.

Third Implementation:

After obtaining the test data from any test data generation unit 111, the functional safety module 12 can perform fault injection processing on an algorithm parameter of a preset check algorithm. For example, the preset check algorithm is a CRC algorithm, and during use of the CRC algorithm, generally a redundancy bit with a specific bit needs to be added after data to be transmitted, where a value of the redundancy bit with the specific bit may be taken as an algorithm parameter of the CRC algorithm. In this case, the specific bit can be modified into another bit, to obtain the preset check algorithm whose algorithm parameter is performed with fault injection processing.

For another example, if there may be several numerical values in the CRC polynomial involved in the CRC algorithm, and these numerical values may also be taken as algorithm parameters of the CRC algorithm, at least some of these numerical values may be modified to other numerical values, so as to obtain the preset check algorithm whose algorithm parameter is performed with fault injection processing. Subsequently, the functional safety module 12 can perform check operation processing on the obtained test data according to the preset check algorithm whose algorithm parameter is performed with fault injection processing. For example, the functional safety module 12 can perform a CRC operation on the obtained test data according to the CRC polynomial with at least some of the numerical values having been modified, to obtain a corresponding CRC value. The obtained CRC value may be taken as the second processing result.

In view of the above, in the foregoing "first implementation", regarding the test data, the second processing result can be obtained efficiently and reliably by first performing fault injection processing and then performing check operation processing. In the foregoing "second implementation", regarding the test data, the second processing result can be obtained efficiently and reliably by first performing check operation processing and then performing fault injection processing. In the foregoing "third implementation", the second processing result can be obtained efficiently and reliably by first introducing a fault in a calculation part of the preset check algorithm and then performing check operation processing on the test data.

Figure 2:
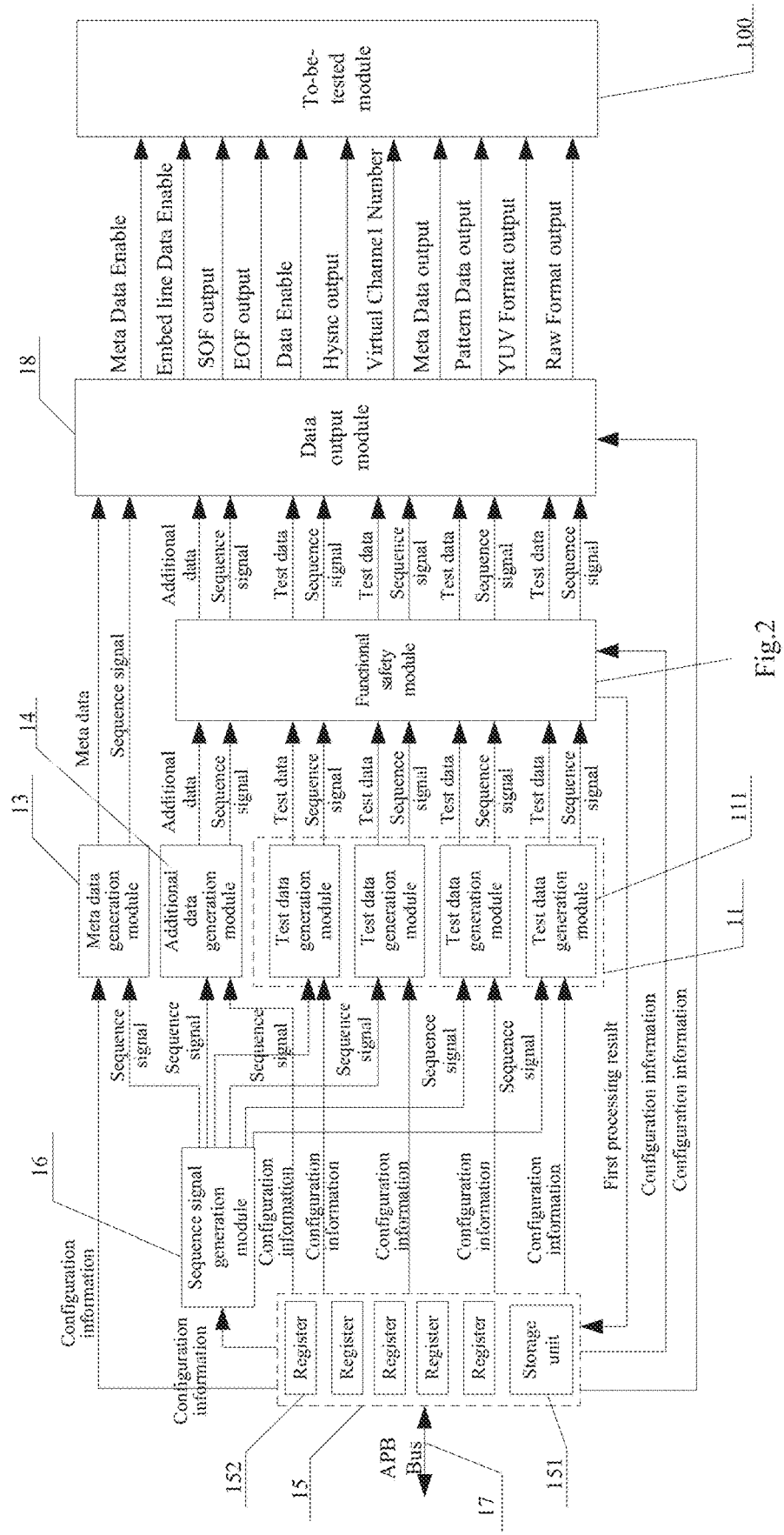
FIG. 2 is a schematic structural diagram of a test circuit for a to-be-tested module according to another exemplary embodiment of the present disclosure.

In an optional example, as shown in FIG. 2, the circuit further includes a meta data generation module 13, which is electrically connected to the to-be-tested module 100, and corresponds to one test data generation unit 111 in the test data generation module 11.

The meta data generation module 13 is configured to generate meta data corresponding to the test data generated by its corresponding test data generation unit 111. The to-be-tested module 100 is configured to generate the test result based on the test data, the first processing result, the second processing result, and the meta data.

It should be noted that correspondence between the meta data generation module 13 and one test data generation unit 111 in the test data generation module 11 refers to that the meta data generated by the meta data generation module 13 has the same time sequence as the test data generated by the test data generation unit 111, and the meta data generated by the meta data generation module 13 is meta data generated for the test data generation unit 111. In this case, it may be considered that the meta data generation module 13 is bound to the test data generation unit 111.

Optionally, a data bit width of the meta data can be configured according to an actual situation; for example, it can be configured as 4 bits or 8 bits. In addition, a value of the meta data may be a random value, or may be generated based on a fixed mechanism.

The meta data generation module 13 can generate meta data (which is used to simulate real meta data) corresponding to the test data generated by its bound test data generation unit 111. The generated meta data can be used to indicate whether the test data is modified.

In addition, through the electrical connection between the meta data generation module 13 and the to-be-tested module 100, the generated meta data can be provided to the to-be-tested module 100. In this way, the to-be-tested module 100 can generate the test result based on the test data, the first processing result, and the second processing result that are provided by the functional safety module 12, and the meta data provided by the meta data generation module 13.

Specifically, if the second processing result is obtained according to the foregoing "third implementation", the to-be-tested module 100 can perform a CRC operation on the test data provided by the functional safety module 12 according to the preset CRC polynomial, to obtain a corresponding CRC value. If the obtained CRC value is the same to the first processing result provided by the functional safety module 12 but it is different from the second processing result provided by the functional safety module 12, and the meta data provided by the meta data generation module 13 is used to indicate that the test data is not modified, the generated test result may be used to represent that when the test data generation unit 111 bound to the meta data generation module 13 is used for testing, the to-be-tested module 100 passes the test. Otherwise, the generated test result may be used to represent that when the test data generation unit 111 bound to the meta data generation module 13 is used for testing, the to-be-tested module 100 does not pass the test.

In this embodiment of the present disclosure, through disposing of the meta data generation module 13, the meta data generated by the meta data generation module 13 can be provided to the to-be-tested module 100. In this way, during generation of the test result, in addition to the test data, the first processing result, and the second processing result, reference may also be made to the meta data. In other words, during generation of the test result, there may be more data for reference, which helps to improve accuracy and reliability of the test result.

In an optional example, as shown in FIG. 2, the circuit further includes an additional data generation module 14, and the additional data generation module 14 is electrically connected to the functional safety module 12.

The additional data generation module 14 is configured to generate additional data (embed line data) corresponding to the test data. The functional safety module 12 is further configured to perform check operation processing on the additional data to obtain a third processing result, and to perform check operation processing and fault injection processing on the additional data to obtain a fourth processing result.

The to-be-tested module 100 is further configured to generate the test result based on the test data, the first processing result, the second processing result, the additional data, the third processing result, and the fourth processing result.

It should be noted that, different from the meta data generation module 13 described above, the additional data generation module 14 may not be bound to a certain test data generation unit 111 in the test data generation module 11; for each test data generation unit 111 in the test data generation module 11, the additional data generation module 14 can generate the corresponding additional data. Here, a quantity of lines of the additional data, a quantity of valid points in each line, a position of appearance, and the like can be configured in advance. A TAG can be added to the additional data, and the TAG can be used to indicate which data in the additional data is valid and which data is invalid. In addition, the TAG can also be used to recognize a header of a data packet.

The additional data generation module 14 can generate additional data (which is used to simulate real additional data) corresponding to the test data generated by any test data generation unit 111. The generated additional data can include distortion-related information of the test data. State information (such as temperature information or voltage information) and the like of the automotive AI chip are included when the test data is generated. In addition, through the electrical connection between the additional data generation module 14 and the functional safety module 12, the generated additional data can be provided to the functional safety module 12.

In addition, the functional safety module 12 can perform functional safety-related processing based on the obtained additional data; for example, it perform check operation processing on the obtained additional data, to obtain the third processing result, and it also performs check operation processing and fault injection processing on the obtained additional data, to obtain the fourth processing result. Specifically, for manners of obtaining the third processing result and the fourth processing result, reference may be made to the description of the manners of obtaining the first processing result and the second processing result in the foregoing embodiment, and details are not described herein again.

After obtaining the third processing result and the fourth processing result, the functional safety module 12 can provide the obtained additional data, the obtained third processing result, and the obtained fourth processing result to the to-be-tested module 100 through the electrical connection between the functional safety module 12 and the to-be-tested module 100. In this way, the to-be-tested module 100 can generate the test result based on the test data, the first processing result, the second processing result, the additional data, the third processing result, and the fourth processing result that are provided by the functional safety module 12.

Specifically, if the second processing result is obtained according to the foregoing "third implementation", and the fourth processing result is obtained in a similar way, the to-be-tested module 100 can perform a CRC operation on the test data provided by the functional safety module 12 according to the preset CRC polynomial, to obtain a corresponding CRC value; for ease of distinction, the CRC value is referred to as a first CRC value below. And the additional data provided by the functional safety module 12 is performed with a CRC operation according to the preset CRC polynomial, to obtain a corresponding CRC value; for ease of distinction, this CRC value is referred to as a second CRC value below.

If the first CRC value is the same to the first processing result provided by the functional safety module 12 but is different from the second processing result provided by the functional safety module 12, and the second CRC value is the same to the third processing result provided by the functional safety module 12 but is different from the fourth processing result provided by the functional safety module 12, the generated test result may be used to represent that when the test data generation unit 111 corresponding to the additional data provided by the functional safety module 12 is used for testing, the to-be-tested module 100 passes the test. Otherwise, the generated test result may be used to represent that when the test data generation unit 111 corresponding to the additional data provided by the functional safety module 12 is used for testing, the to-be-tested module 100 does not pass the test.

In this embodiment of the present disclosure, through disposing of the additional data generation module 14, the additional data generated by the additional data generation module 14 can be provided to the to-be-tested module 100. In this way, during generation of the test result, in addition to the test data, the first processing result, and the second processing result, reference may also be made to the additional data, the third processing result, and the fourth processing result. In other words, during generation of the test result, there may be more data for reference, which helps to improve accuracy and reliability of the test result.

In an optional example, as shown in FIG. 2, the circuit further includes a configuration module 15 and a sequence signal generation module 16. If the circuit further includes a meta data generation module 13 and an additional data generation module 14, the configuration module 15 stores respective configuration information of each test data generation unit 111, the functional safety module 12, the meta data generation module 13, the additional data generation module 14, and the sequence signal generation module 16.

The sequence signal generation module 16 is configured to generate respective sequence signals of each test data generation unit 111, the meta data generation module 13, and the additional data generation module 14 based on the respective configuration information of each test data generation unit 111, the meta data generation module 13, and the additional data generation module 14.

Each test data generation unit 111, the meta data generation module 13, and the additional data generation module 14 are respectively configured to generate respective data based on the respective sequence signals.

Here, the configuration module 15 can be electrically connected to a central processing unit (CPU) through a peripheral bus (APB bus) 17. The CPU can configure the configuration module 15 through the APB bus 17, so that the configuration module 15 stores the respective configuration information of each test data generation unit 111, the functional safety module 12, the meta data generation module 13, the additional data generation module 14, and the sequence signal generation module 16.

In this embodiment of the present disclosure, the configuration module 15 can be electrically connected to each test data generation unit 111, the functional safety module 12, the meta data generation module 13, the additional data generation module 14, and the sequence signal generation module 16, respectively. Through these electrical connections, the configuration module 15 can respectively provide corresponding configuration information to each test data generation unit 111, the functional safety module 12, the meta data generation module 13, the additional data generation module 14, and the sequence signal generation module 16, so that each test data generation unit 111, the functional safety module 12, the meta data generation module 13, the additional data generation module 14, and the sequence signal generation module 16 configure themselves based on the respective obtained configuration information.

For example, through configuration, the meta data generation module 13 can be bound to any test data generation unit 111 in the test data generation module 11; a quantity of lines and a position of appearance (which can be either in front of the test data or behind the test data) of the additional data generated by the additional data generation module 14 may be set, a data format of the additional data may be different from that of the corresponding test data, and whether a TAG is added to the additional data may be set; the test data generation unit 111 used for actual testing in the test data generation module 11 may be selected; and delays in a plurality of lines may exist between the test data generated by various test data generation units 111, and a specific delay value may be set yet. After the configuration is completed, merely being triggered by using an enable signal, each test data generation unit 111, the functional safety module 12, the meta data generation module 13, the additional data generation module 14, and the sequence signal generation module 16 can operate automatically based on configured information.

It should be noted that the sequence signal generation module 16 can refer to the respective configuration information of each test data generation unit 111, the meta data generation module 13, and the additional data generation module 14, to determine when each test data generation unit 111, the meta data generation module 13, and the additional data generation module 14 need to perform data generation, so as to generate respective sequence signals of each test data generation unit 111, the meta data generation module 13, and the additional data generation module 14 accordingly.

Optionally, the sequence signal at least includes one or more of the following signals: an SOF signal, an EOF signal, a Hsync signal, and a Date Enable signal. The SOF signal is a signal indicating start of the test data, the EOF signal is a signal indicating end of the test data, the Hsync signal is a line synchronization signal, and the Date Enable signal is a line-data valid signal.

In addition, the sequence signal of the additional data generation module 14 may include a line sequence signal, and the line sequence signal may include a quantity of line blanking cycles and a quantity of valid points in a line. The respective sequence signals of each test data generation unit 111, the meta data generation module 13, and the additional data generation module 14 may be independent. The sequence signals of different test data generation units 111 cannot overlap with each other (this can be achieved by controlling a quantity of blanking cycles between data), and the sequence signals between different test data generation units 111 may span frames. For example, when a certain test data generation unit 111 has not finished outputting the test data, another test data generation unit 111 can start outputting the test data.

In addition, the sequence signal generation module 16 can be electrically connected to each test data generation unit 111, the meta data generation module 13, and the additional data generation module 14, respectively. Through these electrical connections, the sequence signal generation module 16 can respectively provide corresponding sequence signals for each test data generation unit 111, the meta data generation module 13, and the additional data generation module 14, so that each test data generation unit 111, the meta data generation module 13, and the additional data generation module 14 generate and output data at corresponding time points based on the respective obtained sequence signals.

In this embodiment of the present disclosure, through disposing of the configuration module 15, each test data generation unit 1, the functional safety module 12, the meta data generation module 13, the additional data generation module 14, and the sequence signal generation module 16 all obtain respective configuration information, so as to implement configuration of various units and modules, thereby ensuring reliable operation of each unit and module. In addition, through disposing of the sequence signal generation module 16, each test data generation unit 111, the meta data generation module 13, and the additional data generation module 14 can all obtain respective sequence signals, so as to generate and output data at suitable time points, thereby helping to ensure reliable and stable operation of the entire circuit.

In an optional example, the functional safety module 12 is further configured to perform fault injection processing on the sequence signal, and the to-be-tested module 100 is configured to generate the test result based on the test data, the first processing result, the second processing result, and the sequence signal that is performed with fault injection processing.

In this embodiment of the present disclosure, each test data generation unit 111 and the additional data generation module 14 can provide the respective sequence signals to the functional safety module 12. After obtaining the sequence signal from any test data generation unit 111 or the additional data generation module 14, the functional safety module 12 can perform fault injection processing on the obtained sequence signal. For example, Date Enable signals of some valid lines in the obtained sequence signal may be removed (CROP), and an SOF signal or an EOF signal in the obtained sequence signal may be removed.

In addition, through the electrical connection between the functional safety module 12 and the to-be-tested module 100, the sequence signal performed with fault injection processing can be provided to the to-be-tested module 100. In this way, the to-be-tested module 100 can generate the test result based on the test data, the first processing result, the second processing result, and the sequence signal performed with fault injection processing, which are provided by the functional safety module 12. Because information referenced when generating the test result includes the test data, the first processing result, and the second processing result, and also includes the sequence signal performed with fault injection processing, the information helps to detect a loss of an entire frame of data or an entire line of data. Optionally, if the test result also includes a data loss, the test result can be further improved.

In an optional example, as shown in FIG. 2, the configuration module 15 includes a storage unit 151 and a plurality of registers 152. Each register 152 stores the configuration information, and each test data generation unit 111, the functional safety module 12, the meta data generation module 13, the additional data generation module 14, and the sequence signal generation module 16 respectively correspond to different registers 152 in the configuration module 15.

Each test data generation unit 111, the functional safety module 12, the meta data generation module 13, the additional data generation module 14, and the sequence signal generation module 16 are respectively configured to configure themselves based on the configuration information in the corresponding registers 152 of the configuration module 15.

The functional safety module 12 is further configured to store the first processing result to the storage unit 151.

A correspondence between on one hand each of each test data generation unit 111, the functional safety module 12, the meta data generation module 13, the additional data generation module 14, and the sequence signal generation module 16, and on the other hand the corresponding register 152 in the configuration module 15 can be preset.

Optionally, in the correspondence, quantities of registers 152 respectively corresponding to each test data generation unit 111, the functional safety module 12, the meta data generation module 13, the additional data generation module 14, and the sequence signal generation module 16 may be the same or different.

In this embodiment of the present disclosure, the configuration module 15 can provide the configuration information stored in each register 152 to the corresponding unit or module based on the correspondence. In this way, each test data generation unit 111, the functional safety module 12, the meta data generation module 13, the additional data generation module 14, and the sequence signal generation module 16 can all obtain the respective configuration information, so as to complete respective configuration based on the respective configuration information, thereby ensuring automatic operations of each test data generation unit 111, the functional safety module 12, the meta data generation module 13, the additional data generation module 14, and the sequence signal generation module 16. Because the configuration information of each unit and module is stored in the corresponding register 152, a possibility of errors in providing the configuration information to each unit and module by the configuration module 15 can be reduced as low as possible.

In addition, the functional safety module 12 can also provide the first processing result to the configuration module 15, so that the configuration module 15 stores the first processing result to the storage unit 151. Subsequently, the CPU can read the first processing result in the storage unit 151 as required. The read first processing result can be used for external check of the to-be-tested module 100.

It should be noted that the functional safety module 12 can also store the third processing result described above to the storage unit 151; the CPU can also read the third processing result in the storage unit 151 as required; and the read third processing result can also be used for external check of the to-be-tested module 100.

In an optional example, as shown in FIG. 2, the circuit further includes a data output module 18.

The data output module 18 is respectively electrically connected to the functional safety module 12, the meta data generation module 13, and the to-be-tested module 100. The data output module 18 is configured to output at least one of the following items to the to-be-tested module 100:

information representing whether meta data is currently output;

information representing whether additional data is currently output;

information representing whether the test data is currently output;

the sequence signal corresponding to the test data that is currently output;

information indicating the test data generation unit 111, meta data, test data, and additional data, all of which correspond to the test data that is currently output; and information indicating the data type of the test data that is currently output.

Here, the data output module 18 may be provided with a meta data enabling interface (that is, the interface with Meta Data Enable displayed on the right side in FIG. 2), an additional data enabling interface (that is, the interface with Embed line Data Enable displayed on the right side in FIG. 2), sequence signal output interfaces (including the interfaces with SOF output, EOF output, and Hysnc output shown on the right side in FIG. 2), a test data enabling interface (that is, the interface with Data Enable displayed on the right side in FIG. 2), a channel indication interface (that is, the interface with Virtual Channel1 Number displayed on the right side in FIG. 2), a meta data output interface (that is, the interface with Meta Data output displayed on the right side in FIG. 2), a test data and additional data output interface (that is, the interface with Pattern Data output displayed on the right side in FIG. 2), and data type indication interfaces (including the interfaces with YUV Format output and Raw Format output displayed on the right side in FIG. 2).

The meta data enabling interface is configured to output the information representing whether the meta data is currently output; the additional data enabling interface is configured to output the information representing whether the additional data is currently output; the test data enabling interface is configured to output the information representing whether the test data is currently output; the sequence signal output interface is configured to output the sequence signal corresponding to the test data that is currently output; the channel indication interface is configured to output the information indicating the test data generation unit 111 corresponding to the test data that is currently output; the meta data output interface is configured to output the meta data; the test data and additional data output interface is configured to output the test data and the additional data; and the data type indication interface is configured to output the information indicating the data type of the test data that is currently output.

In this embodiment of the present disclosure, the data output module 18 is respectively electrically connected to the functional safety module 12 and the meta data generation module 13, and the functional safety module 12 is respectively electrically connected to each test data generation module 111 and the additional data generation module 14; therefore, data respectively generated by each test data generation module 111, the meta data generation module 13, and the additional data generation module 14, and the respective sequence signals of each test data generation module 111, the meta data generation module 13, and the additional data generation module 14 can all be provided to the data output module 18, and the data output module 18 can output relevant information, signals, and data accordingly, so that the to-be-tested module 100 generates the test result based on the information, the signals, and the data output by the data output module 18.

Specifically, as shown in FIG. 2, the test data generation module 11 may include four test data generation units 111. In a sequence from top to bottom, the four test data generation units 111 serve as the first data generation channel, the second data generation channel, the third data generation channel, and the fourth data generation channel in sequence. Optionally, the meta data generation module 13 specifically may be bound to the test data generation unit 111 that serves as the second data generation channel.

Assuming that the test data generated by the test data generation unit 111 that serves as the second data generation channel and the meta data generated by the meta data generation module 13 currently need to be output, in the interfaces disposed in the data output module 18 shown in FIG. 2: the interface with Meta Data output displayed on the right side can output the meta data generated by the meta data generation module 13, and the interface with Pattern Data output displayed on the right side can output the test data generated by the test data generation unit 111 that serves as the second data generation channel; and when the test data generated by the test data generation unit 111 that serves as the second data generation channel is YUV data, the interface with YUV Format output displayed on the right side can output "1", and the interface with Raw Format output displayed on the right side can output "0", so as to indicate that a data type of the test data that is currently output is a YUV type rather than a Raw type. When the test data generated by the test data generation unit 11 that serves as the second data generation channel is Raw data, the interface with YUV Format output displayed on the right side in FIG. 2 can output "0", and the interface with Raw Format output displayed on the right side in FIG. 2 can output "1", so as to indicate that a data type of the test data that is currently output is a Raw type rather than a YUV type.

In view of the above, in this embodiment of the present disclosure, through disposing of the data output module 18, the relevant information, signals, and data can be efficiently and reliably output to the to-be-tested module 100, so that the to-be-tested module 100 performs subsequent processing accordingly.

In an optional example, different test data generation units 111 correspond to different gain values.

Each test data generation unit 111 is configured to apply a corresponding gain value to the raw data consistent with the data type supported by the test data generation unit 111, to generate the test data consistent with the data type.

In a specific implementation, different test data generation units correspond to different gain-value sets.

The gain value corresponding to each test data generation unit 111 is selected from the corresponding gain-value set, and the gain value corresponding to each test data generation unit 111 is switched cyclically in a preset manner.

Here, a correspondence between the test data generation unit 111 and the gain-value set can be preset; and respective gain-value sets corresponding to different test data generation units 111 may be different.

Any test data generation unit 111 can determine a self-corresponding gain-value set (a gain-value set corresponding to this test data generation unit 111 itself) according to the preset correspondence, and then select a gain value from the self-corresponding gain-value set to serve as the self-corresponding gain value, and generate the corresponding test data by applying the self-corresponding gain value to the raw data.

It should be noted that the gain value corresponding to any test data generation unit 111 can be switched cyclically in the preset manner. Two specific manners of the cyclic switching are described below.

First Manner:

Assuming that there are three gain values, which respectively are gain value 1, gain value 2, gain value 3, in the gain-value set corresponding to a test data generation unit 111, and an gain value initially corresponding to the test data generation unit 111 is the gain value 1, the corresponding gain value may be switched to the gain value 2 after a preset time period (such as 1 second, 2 seconds, or 5 seconds), then the corresponding gain value can be switched to the gain value 3 after another preset time period, and then the corresponding gain value can be switched to the gain value 1 after still another preset time period. The other may be obtained by analogy, and details are not described here.

Second Manner:

Assuming that there are three gain values, which respectively are gain value 1, gain value 2, gain value 3, in the gain-value set corresponding to a test data generation unit 111, and an gain value initially corresponding to the test data generation unit 111 is the gain value 1, the corresponding gain value may be switched to the gain value 2 after test data is generated based on the gain value 1 for a preset quantity of times (such as 3 times, 4 times, or 5 times), then the corresponding gain value can be switched to the gain value 3 after test data is generated based on the gain value 2 for a preset quantity of times, and then the corresponding gain value can be switched to the gain value 1 after test data is generated based on the gain value 3 for a preset quantity of times. The other may be obtained by analogy, and details are not described herein.

In this implementation, by selecting the gain value from the gain-value set, the gain value corresponding to the test data generation unit 111 can be determined very efficiently and reliably, and a change of the test data generated by the test data generation unit 111 can be implemented through the cyclic switching of the gain value.

Certainly, the corresponding gain-value set may not be respectively set for each test data generation unit 111. In contrast, a gain value is merely respectively set for each test data generation unit 111. Each test data generation unit 111 can generate the test data by using the gain value that is fixedly set therefor. Alternatively, each test data generation unit 111 can perform processing of cyclical reversing for low data bit(s) or taking a value of 0 or a value of 1 for all specific data bits on the gain value that is set therefor. Each test data generation unit 111 may generate the test data by using a processing result of the gain value that is set therefor.

In view of the above, in this embodiment of the present disclosure, for any test data generation unit 111, the test data can be generated efficiently and reliably by applying the corresponding gain value to the raw data, so as to perform subsequent processing by using the generated test data. Moreover, even if raw data corresponding to various test data generation units 111 is the same, it only needs to be ensured that the gain values corresponding to different test data generation units 111 are different, then it may be ensured that the test data generated by different test data generation units 111 is different, thereby simulating effects of long and short exposures.

In view of the above, by using the test circuit for the to-be-tested module 100 provided in this embodiment of the present disclosure, not only multi-channel exposure-camera data streams can be simulated (that is, different test data is generated by different test data generation units 111), where a time sequence of each exposure data stream may be independent; and the generation of the meta data and the test data can also be simulated.

Moreover, a dedicated functional safety module 12 is also designed to perform functional safety-related processing. A parity data protection bit (corresponding to the Parity protection algorithm described above) can be added to the data stream, and a frame CRC value of each data generation channel (corresponding to the CRC algorithm described above) can be calculated and stored, furthermore, a security mechanism in a perception system can also be checked according to a method of injecting a fault in the data stream (corresponding to the fault injection processing described above), so as to finally implement multi-channel testing to meet the application requirement for processing multi-channel inputs.

Exemplary Method

Figure 3:
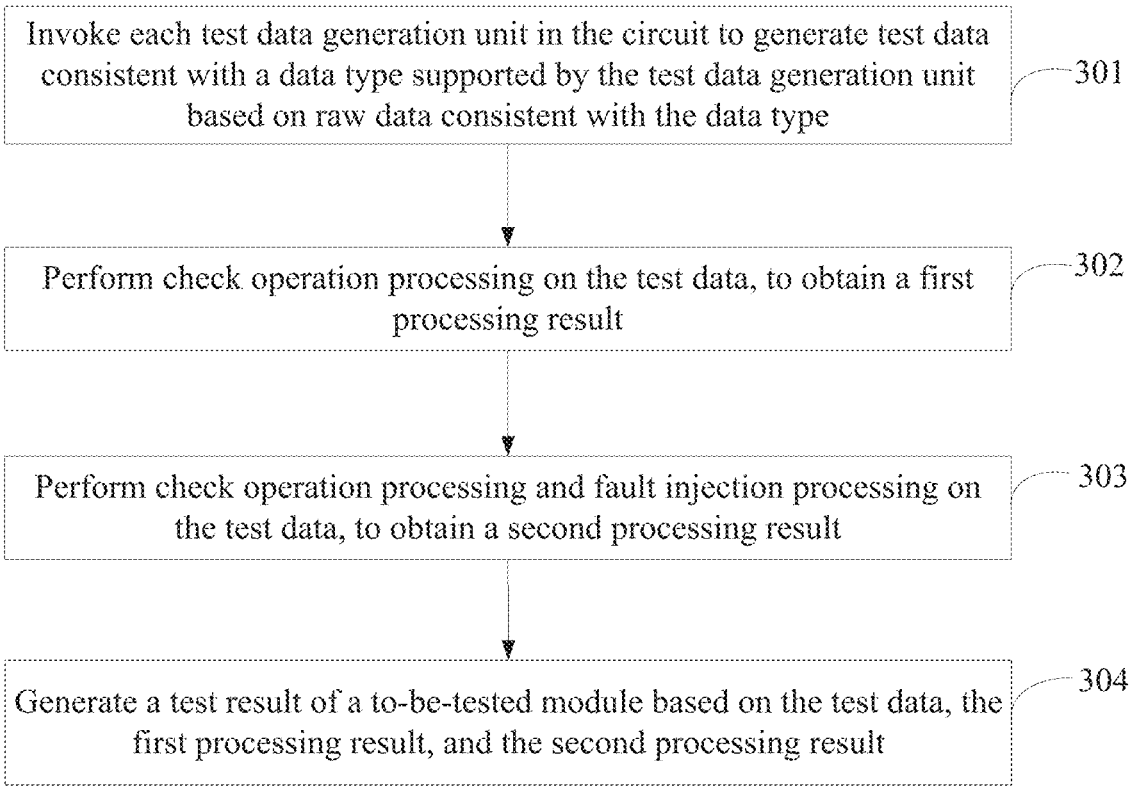
FIG. 3 is a schematic flowchart of a test method for a to-be-tested module according to an exemplary embodiment of the present disclosure.

FIG. 3 is a schematic flowchart of a test method for a to-be-tested module according to an exemplary embodiment of the present disclosure. The method shown in FIG. 3 is applied to the test circuit for a to-be-tested module in the section of exemplary circuit described above. The method shown in FIG. 3 includes step 301, step 302, step 303, and step 304.

Specifically, at step 301, each test data generation unit in the circuit is invoked to generate test data consistent with a data type supported by the test data generation unit based on raw data consistent with the data type.

At step 302, the test data is performed check operation processing, to obtain a first processing result.

At step 303, the test data is performed check operation processing and fault injection processing, to obtain a second processing result.

At step 304, a test result of a to-be-tested module is generated based on the test data, the first processing result, and the second processing result.

It should be noted that, for specific implementation processes of step 301 to step 304, reference may be made to the relevant description in the section of exemplary circuit, and details are not described here again. Corresponding to the section of exemplary system, the test method for a to-be-tested module provided in this embodiment of the present disclosure can also implement multi-channel testing, so as to meet the application requirement for processing multi-channel inputs.

Any test method for a to-be-tested module provided in this embodiment of the present disclosure can be implemented by any suitable device with a data processing capability, including but not limited to a terminal device and a server. Optionally, any test method for a to-be-tested module provided in this embodiment of the present disclosure may be implemented by a processor. For example, the processor implements any test method for a to-be-tested module described in this embodiment of the present disclosure by invoking corresponding instructions stored in a memory.

Exemplary Apparatus

Figure 4:
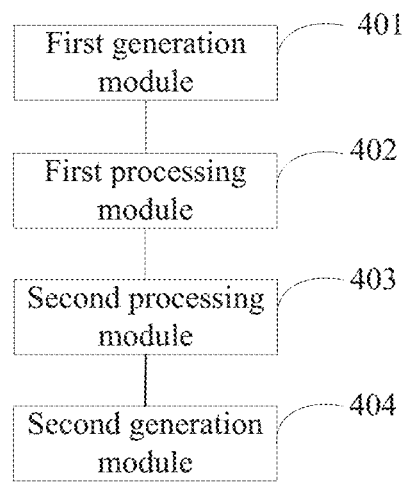
FIG. 4 is a schematic structural diagram of a test apparatus for a to-be-tested module according to an exemplary embodiment of the present disclosure.

FIG. 4 is a schematic structural diagram of a test apparatus for a to-be-tested module according to an exemplary embodiment of the present disclosure. The apparatus shown in FIG. 4 is applied to the test circuit for a to-be-tested module in the section of exemplary circuit described above. The apparatus shown in FIG. 4 includes a first generation module 401, a first processing module 402, a second processing module 403, and a second generation module 404.

The first generation module 401 is configured to invoke each test data generation unit in the circuit, to generate test data consistent with a data type supported by the test data generation unit based on raw data consistent with the data type.

The first processing module 402 is configured to perform check operation processing on the test data generated by the first generation module 401, to obtain a first processing result.

The second processing module 403 is configured to perform check operation processing and fault injection processing on the test data generated by the first generation module 401, to obtain a second processing result.

The second generation module 404 is configured to generate a test result of the to-be-tested module based on the test data generated by the first generation module 401, the first processing result obtained by the first processing module 402, and the second processing result obtained by the second processing module 403.

Exemplary Electronic Device

An electronic device according to an embodiment of the present disclosure is described below with reference to FIG. 5. The electronic device may be any one or two of a first device and a second device, or a stand-alone device separated from the first device and the second device, where the stand-alone device may communicate with the first device and the second device, to receive an obtained input signal therefrom.

Figure 5:
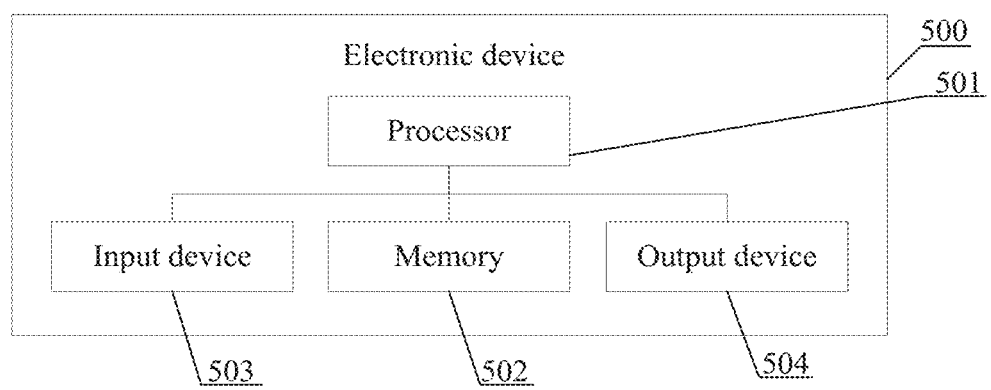
FIG. 5 is a structural diagram of an electronic device according to an exemplary embodiment of the present disclosure.

FIG. 5 shows a block diagram of an electronic device according to an embodiment of the present disclosure.

As shown in FIG. 5, an electronic device 500 includes one or more processors 501 and a memory 502.

The processor 501 may be a central processing unit (CPU) or another form of processing unit having a data processing capability and/or an instruction execution capability, and may control another component in the electronic device 500 to perform a desired function.

The memory 502 may include one or more computer program products. The computer program product may include various forms of computer readable storage media, such as a volatile memory and/or a non-volatile memory. The volatile memory may include, for example, a random access memory (RAM) and/or a cache. The nonvolatile memory may include, for example, a read-only memory (ROM), a hard disk, and a flash memory. One or more computer program instructions may be stored on the computer readable storage medium. The processor 501 can run the program instruction to implement the test method for a to-be-tested module according to the foregoing various embodiments of the present disclosure and/or other expected functions. Various contents such as an input signal, a signal component, and a noise component may also be stored in the computer readable storage medium.

In an example, the electronic device 500 may further include an input device 503 and an output device 504. These components are connected with each other through a bus system and/or another form of connection mechanism (not shown). For example, the input device 503 may be a sensor or a sensor array, or the input device 503 may be a communication network connector for receiving a collected input signal.

In addition, the input device 503 may further include, for example, a keyboard and a mouse.

The output device 504 can output various information to the outside, including determined distance information, direction information, and the like. The output device 504 may include, for example, a display, a loudspeaker, a printer, a communication network, and a remote output device connected by the communication network.

Certainly, for simplicity, FIG. 5 shows only some of components in the electronic device 500 that are related to the present disclosure, and components such as a bus and an input/output interface are omitted. In addition, according to specific application situations, the electronic device 500 can further include any other appropriate components.

Exemplary Computer Program Product and Computer Readable Storage Medium

In addition to the foregoing method and device, the embodiments of the present disclosure may further relate to a computer program product, which includes computer program instructions. When the computer program instructions are executed by a processor, the processor is enabled to perform the steps, of the test method for a to-be-tested module according to the embodiments of the present disclosure, that are described in the "exemplary method" section of this specification.

The computer program product may be program codes, written with one or any combination of a plurality of programming languages, that are configured to perform the operations in the embodiments of the present disclosure. The programming languages include an object-oriented programming language such as Java or C++, and further include a conventional procedural programming language such as a "C" language or a similar programming language. The program codes may be entirely or partially executed on a user computing device, executed as an independent software package, partially executed on a user computing device and partially executed on a remote computing device, or entirely executed on a remote computing device or a server.

In addition, the embodiments of the present disclosure may further relate to a computer readable storage medium, which stores computer program instructions. When the computer program instructions are executed by a processor, the processor is enabled to perform such steps of the test method for a to-be-tested module according to the embodiments of the present disclosure that are described in the "exemplary method" section of this specification.

The computer readable storage medium may be one readable medium or any combination of a plurality of readable media. The readable medium may be a readable signal medium or a readable storage medium. The readable storage medium may include, for example, but is not limited to electricity, magnetism, light, electromagnetism, infrared ray, or a semiconductor system, apparatus or device, or any combination of the above. More specific examples (a non-exhaustive list) of the readable storage medium include: an electrical connection with one or more conducting wires, a portable disk, a hard disk, a random access memory (RAM), a read-only memory (ROM), an erasable programmable read-only memory (EPROM) or a flash memory, an optical fiber, a portable compact disk read-only memory (CD-ROM), an optical storage device, a magnetic storage device, or any suitable combination of the above.

Basic principles of the present disclosure are described above in combination with the specific embodiments. However, it should be pointed out that the advantages, superiorities, and effects mentioned in the present disclosure are merely examples but are not for limitation, and it cannot be considered that these advantages, superiorities, and effects are necessary for each embodiment of the present disclosure. In addition, specific details of the above disclosure are merely for examples and for ease of understanding, rather than limitations. The foregoing details do not limit that the present disclosure must be implemented by using the foregoing specific details.

The various embodiments in this specification are all described in a progressive way, and each embodiment focuses on a difference from other embodiments. For the same or similar parts among the various embodiments, reference may be made to each other. The system embodiments basically correspond to the method embodiments, and thus are relatively simply described. For related parts, reference may be made to a part of the description of the method embodiments.

The block diagrams of the equipment, the apparatus, the device, and the system involved in the present disclosure are merely exemplary examples and are not intended to require or imply that the equipment, the apparatus, the device, and the system must be connected, arranged, and configured in the manners shown in the block diagrams. It is recognized by a person skilled in the art that, the equipment, the apparatus, the device, and the system may be connected, arranged, and configured in an arbitrary manner. The terms such as "include", "comprise", "contain", and "have" are open terms that mean "including but not limited to", and may be used interchangeably with "including but not limited to". The terms "or" and "and" used herein refer to the term "and/or", and may be used interchangeably with "and/or", unless the context clearly indicates otherwise. The terms "such as" and "for example" used herein refers to the phrase "such as but not limited to", and may be used interchangeably with "such as but not limited to".

The method and the apparatus in the present disclosure may be implemented in many ways. For example, the method and the apparatus in the present disclosure may be implemented by software, hardware, firmware, or any combination of the software, the hardware, and the firmware. The foregoing sequence of the steps of the method is for illustration only, and the steps of the method in the present disclosure are not limited to the sequence specifically described above, unless otherwise specifically stated in any other manner. In addition, in some embodiments, the present disclosure may also be implemented as programs recorded in a recording medium. These programs include machine-readable instructions for implementing the method according to the present disclosure. Therefore, the present disclosure further relates to a recording medium storing a program for implementing the method according to the present disclosure.

It should be further pointed out that, various components or various steps in the apparatus, the device, and the method of the present disclosure may be disassembled and/or recombined. These disassembled and/or recombined components or steps shall be regarded as equivalent solutions of the present disclosure.

The foregoing description about the disclosed aspects is provided, so that the present disclosure can be arrived at or carried out by any person skilled in the art. Various modifications to these aspects are very obvious to a person skilled in the art. Moreover, general principles defined herein may be applicable to other aspects without departing from the scope of the present disclosure. Therefore, the present disclosure is not intended to be limited to the aspect illustrated herein, but to the widest scope consistent with the principles and novel features disclosed herein.

The foregoing description has been given for illustration and description. In addition, this description is not intended to limit the embodiments of the present disclosure to forms disclosed herein. Although a plurality of exemplary aspects and embodiments have been discussed above, a person skilled in the art may recognize certain variations, modifications, changes, additions, and sub-combinations thereof.

What is claimed is:

1. A test circuit for a module to be tested, comprising a test data generation module and a functional safety module, wherein
    the test data generation module comprises a plurality of test data generation units, and each test data generation unit is respectively electrically connected to the functional safety module;
    each test data generation unit is configured to generate test data consistent with a data type supported by the test data generation unit based on raw data consistent with the data type;
    the functional safety module is electrically connected to the module to be tested, and is configured to perform check operation processing on the test data to obtain a first processing result, and to perform check operation processing and fault injection processing on the test data to obtain a second processing result; and
    the module to be tested is configured to perform check operation processing on the test data to obtain a check operation result; generate a test result based on the check operation result, the first processing result, and the second processing result, wherein in a case where the check operation result and the first processing result are the same and the check operation result and the second processing result are different, the test result indicates the module to be tested passes a test.

2. The circuit according to claim 1, wherein the circuit further comprises:
    a metadata generation module, wherein the metadata generation module is electrically connected to the module to be tested, and corresponds to one test data generation unit in the test data generation module;
    the metadata generation module is configured to generate metadata corresponding to the test data generated by the test data generation unit that corresponds to the metadata generation module; and
    the module to be tested is configured to generate the test result based on the test data, the first processing result, the second processing result, and the metadata.

3. The circuit according to claim 1, wherein the circuit further comprises an additional data generation module which is electrically connected to the functional safety module;
    the additional data generation module is configured to generate additional data corresponding to the test data;
    the functional safety module is further configured to perform check operation processing on the additional data to obtain a third processing result, and to perform check operation processing and fault injection processing on the additional data to obtain a fourth processing result; and
    the module to be tested is configured to generate the test result based on the test data, the first processing result, the second processing result, the additional data, the third processing result, and the fourth processing result.

4. The circuit according to claim 1, wherein the circuit further comprises a configuration module and a sequence signal generation module, wherein
    the configuration module stores respective configuration information of each test data generation unit, the functional safety module, a metadata generation module, an additional data generation module, and the sequence signal generation module; and
    the sequence signal generation module is configured to generate respective sequence signals of each test data generation unit, the metadata generation module, and the additional data generation module based on the respective configuration information of each test data generation unit, the metadata generation module, and the additional data generation module, wherein each test data generation unit, the metadata generation module, and the additional data generation module are respectively configured to generate respective data based on the respective sequence signals.

5. The circuit according to claim 4, wherein
    the functional safety module is further configured to perform fault injection processing on the sequence signal; and
    the module to be tested is configured to generate the test result based on the test data, the first processing result, the second processing result, and the sequence signal which is performed with fault injection processing.

6. The circuit according to claim 4, wherein the configuration module further comprises a storage unit and a plurality of registers;
each of the registers stores the configuration information, and each test data generation unit, the functional safety module, the metadata generation module, the additional data generation module, and the sequence signal generation module respectively correspond to different registers of the configuration module;
each test data generation unit, the functional safety module, the metadata generation module, the additional data generation module, and the sequence signal generation module are respectively configured to configure themselves based on the configuration information in the corresponding registers of the configuration module; and
the functional safety module is further configured to store the first processing result to the storage unit.

7. The circuit according to claim 6, wherein the functional safety module is further configured to store the third processing result to the storage unit.

8. The circuit according to claim 7, wherein the data output module is provided with a metadata enabling interface, configured to output the information representing whether the metadata is currently output;
an additional data enabling interface, configured to output the information representing whether the additional data is currently output;
sequence signal output interfaces, configured to output the sequence signal corresponding to the test data that is currently output;
a test data enabling interface, configured to output the information representing whether the test data is currently output;
a channel indication interface, configured to output the information indicating the test data generation unit corresponding to the test data that is currently output;
a metadata output interface, configured to output the metadata;
a test data and additional data output interface, configured to output the test data and the additional data; and
data type indication interfaces, configured to output the information indicating the data type of the test data that is currently output.

9. The circuit according to claim 4, wherein the circuit further comprises a data output module;
the data output module is respectively electrically connected to the functional safety module, the metadata generation module, and the module to be tested; and
the data output module is configured to output at least one of the following items to the module to be tested:
information representing whether metadata is currently output;
information representing whether additional data is currently output;
information representing whether the test data is currently output;
the sequence signal corresponding to the test data that is currently output;
information indicating the test data generation unit, metadata, test data, and additional data which all correspond to the test data that is currently output; and
information indicating the data type of the test data that is currently output.

10. The circuit according to claim 4, wherein the respective sequence signals of each test data generation unit, the metadata generation module, and the additional data generation module is independent; and/or
the sequence signals of different test data generation units are separate with each other, and the sequence signals between different test data generation units are able to span frames.

11. The circuit according to claim 1, wherein
the functional safety module is configured to perform fault injection processing on the test data, and perform, according to a preset check algorithm, check operation processing on the test data which is performed with fault injection processing, to obtain the second processing result;
or
the functional safety module is configured to perform check operation processing on the test data according to a preset check algorithm, and perform fault injection processing on an obtained check operation processing result, to obtain the second processing result;
or
the functional safety module is configured to perform fault injection processing on an algorithm parameter of a preset check algorithm, and perform check operation processing on the test data according to the preset check algorithm whose algorithm parameter is performed with fault injection processing, to obtain the second processing result.

12. The circuit according to claim 1, wherein different test data generation units correspond to different gain values; and
each test data generation unit is configured to apply a corresponding gain value to the raw data consistent with the data type supported by the test data generation unit, to generate the test data consistent with the data type.

13. The circuit according to claim 12, wherein different test data generation units correspond to different gain-value sets; and
the gain value corresponding to each test data generation unit is selected from the corresponding gain-value set, and the gain value corresponding to each test data generation unit is switched cyclically in a preset manner.

14. The circuit according to claim 13, wherein a correspondence between the test data generation unit and the gain-value set is preset.

15. The circuit according to claim 13, wherein the preset manner for cyclical switching is cyclically switched by a preset time period or a preset quantity of times of generating the test data.

16. The circuit according to claim 1, wherein data types supported by different test data generation units are the same or different.

17. The circuit according to claim 1, wherein raw data corresponding to different test data generation units are the same or different.

18. The circuit according to claim 1, wherein after obtaining the first processing result and the second processing result, the functional safety module provides the obtained test data, the first processing result, and the second processing result to the module to be tested based on the electrical connection between the functional safety module and the module to be tested.

19. A non-transitory computer readable storage medium, wherein the storage medium stores a computer program, and the computer program is used to implement a test method for a module to be tested, wherein the method comprises:
- invoking each test data generation unit in a test circuit to generate test data consistent with a data type supported by the test data generation unit based on raw data consistent with the data type;
- performing check operation processing on the test data, to obtain a first processing result;
- performing check operation processing and fault injection processing on the test data, to obtain a second processing result;
- performing check operation processing on the test data to obtain a check operation result; and
- generating a test result of the module to be tested based on the check operation result, the first processing result, and the second processing result, wherein in a case where the check operation result and the first processing result are the same and the check operation result and the second processing result are different, the test result indicates the module to be tested passes a test.

20. An electronic device, comprising:

a processor; and a memory, configured to store processor-executable computer program instructions, wherein the processor is configured to read the computer program instructions from the memory, and execute the instructions to implement a test method for a module to be tested, wherein the method comprises:
- invoking each test data generation unit in a test circuit to generate test data consistent with a data type supported by the test data generation unit based on raw data consistent with the data type;
- performing check operation processing on the test data, to obtain a first processing result;
- performing check operation processing and fault injection processing on the test data, to obtain a second processing result;
- performing check operation processing on the test data to obtain a check operation result; and
- generating a test result of the module to be tested based on the check operation result, the first processing result, and the second processing result, wherein in a case where the check operation result and the first processing result are the same and the check operation result and the second processing result are different, the test result indicates the module to be tested passes a test.

* * * * *